US010394991B2

United States Patent
Phoon et al.

(10) Patent No.: US 10,394,991 B2
(45) Date of Patent: Aug. 27, 2019

(54) METHODS AND APPARATUS FOR DYNAMICALLY CONFIGURING SOFT PROCESSORS ON AN INTEGRATED CIRCUIT

(71) Applicant: Altera Corporation, San Jose, CA (US)

(72) Inventors: Chee Nouk Phoon, Gelugor (MY); Chee Hak Teh, Bayan Lepas (MY); Kenneth Chong Yin Tan, Bayan Lepas (MY); Kah Wai Lee, Sungai Siput Utara (MY)

(73) Assignee: Altera Corporation, San Jose, CA (US)

( * ) Notice: Subject to any disclaimer, the term of this patent is extended or adjusted under 35 U.S.C. 154(b) by 175 days.

(21) Appl. No.: 15/287,606

(22) Filed: Oct. 6, 2016

(65) Prior Publication Data
US 2018/0101633 A1    Apr. 12, 2018

(51) Int. Cl.
*G06F 17/50* (2006.01)

(52) U.S. Cl.
CPC ........ *G06F 17/5054* (2013.01); *G06F 17/505* (2013.01); *G06F 17/5027* (2013.01)

(58) Field of Classification Search
CPC .. G06F 15/7867; G06F 8/451; G06F 17/5054; G06F 15/7871; G06F 17/50; G06F 8/447; G06F 9/4411; G06F 9/5077; G06F 9/3885
USPC ...................... 716/117, 121, 128; 326/37–39
See application file for complete search history.

(56) References Cited

U.S. PATENT DOCUMENTS

| 7,441,112 | B2 | 10/2008 | Zimmer et al. |
| 7,823,117 | B1 * | 10/2010 | Bennett ............... G06F 17/5054 703/13 |
| 8,533,720 | B2 | 9/2013 | Byrum et al. |
| 8,713,574 | B2 * | 4/2014 | Creamer ............... G06F 9/5027 718/104 |
| 8,862,862 | B2 | 10/2014 | Zimmer et al. |
| 8,863,061 | B2 | 10/2014 | Chua et al. |
| 8,885,334 | B1 | 11/2014 | Baxter |

(Continued)

FOREIGN PATENT DOCUMENTS

EP    2819039 A1    12/2014

*Primary Examiner* — Nghia M Doan
(74) *Attorney, Agent, or Firm* — Treyz Law Group, P.C.; Jason Tsai

(57) ABSTRACT

An offloading engine integrated circuit that includes soft processors may be implemented using an aggregated profiler and a soft processor system generation tool. In particular, the aggregated profiler may generate a suggested configuration for soft processors within the integrated circuit. The soft processor system generation tool may use inputs based on the suggested configuration to generate a configuration bit stream that is used to configure the integrated circuit. Soft processors within the integrated circuits may be arranged in soft processors columns. Parameters for the soft processors and the soft processor columns may be dynamically reconfigured. The parameters may include sizes for each soft processor column, a number of soft processor columns, types (e.g., processor architecture types) of each processor. Multiple soft processor columns may also be grouped together to complete a single task. Interface circuitry may regulate information flow to and from the soft processor columns.

11 Claims, 10 Drawing Sheets

(56) References Cited

U.S. PATENT DOCUMENTS

| | | |
|---|---|---|
| 8,997,033 B1 | 3/2015 | Hew |
| 9,135,213 B2 | 9/2015 | Taylor et al. |
| 9,183,337 B1 | 11/2015 | Nagpal et al. |
| 2002/0152305 A1* | 10/2002 | Jackson .............. H04L 41/5035 709/224 |
| 2005/0268271 A1 | 12/2005 | Gutberlet et al. |
| 2017/0220499 A1* | 8/2017 | Gray ...................... G06F 13/36 |

* cited by examiner

METHODS AND APPARATUS FOR DYNAMICALLY CONFIGURING SOFT PROCESSORS ON AN INTEGRATED CIRCUIT

BACKGROUND

This relates to integrated circuits and, more particularly, to programmable integrated circuits.

Programmable integrated circuits are a type of integrated circuit that can be programmed by a user to implement a desired custom logic function. In a typical scenario, a logic designer uses computer-aided design tools to design a custom logic circuit. When the design process is complete, the computer-aided design tools generate configuration data. The configuration data is loaded into memory elements to configure the devices to perform the functions of the custom logic circuit.

Configuration data may be supplied to a programmable device in the form of a configuration bit stream. After a first configuration bit stream has been loaded onto a programmable device, the programmable device may be reconfigured by loading a different configuration bit stream in a process known as reconfiguration. An entire set of configuration data is often loaded during reconfiguration.

Furthermore, in certain applications, tasks implemented on an integrated circuit can be accelerated by using different processing mechanisms such as a many-core processing system, which is a multi-CPU parallel processing system having multiple processing cores. Applications can then be processed by more than one core processor in parallel so as to improve processing speed. Typically, a system uses fixed core processors with a pre-determined number computational cores to enable parallel processing. However, fixed core processors are dedicated to serve fixed application needs and are not configurable. In other words, these systems provide fixed many-core platforms that are non-scalable.

Situations frequently arise where it would be desirable to design and implement dynamically configurable many-core systems to increase efficiency, flexibility, and scalability associated with performing parallel processing tasks for certain applications.

It is within this context that the embodiments herein arise.

SUMMARY

It is appreciated that the present invention can be implemented in numerous ways, such as a process, an apparatus, a system, a device, or a method on a computer readable medium. Several inventive embodiments of the present invention are described below.

Design tools running on circuit design computing equipment may be used to implement an integrated circuit die (e.g., a programmable integrated circuit) that includes multiple columns of soft processors. The design tools may include an aggregated profiler tool. The aggregated profiler tool may receive a source code relating to one or more applications. The aggregated profiler may analyze the source code to identify any resource-intensive tasks (e.g., tasks that are flagged as hot spots and tasks that are specifically identified using parallel programming directives or pragmas). The aggregated profiler may then output a suggested hardware configuration for the soft processors on the integrated circuit.

In particular, the hardware configuration may include a suggested number of columns for the soft processors, a suggested memory size for the column of soft processors, suggested types of soft processor architectures (e.g., different suggested types of soft processor architectures for at least two of the soft processor columns).

Soft processor columns may in general represent a collection of programmable processing units (e.g., a group of soft processors) that are grouped together (e.g., grouped together by electrical connections, grouped together physically, etc.). The group of soft processors (e.g., a given soft processor column) may be grouped in a column-wise configuration. However, this is merely illustrative. If desired, the group of soft processors may be grouped row-wise or any in any desirable configuration. These configurations may be generally referred to herein as soft processor "columns." In another example, although it may be desirable for the given soft processor column to be grouped physically in close proximity with one another, the group of soft processors may be simply connected or communicate with one another regardless of their physical location. Moreover, the group of soft processors may function as a single unit to perform a single task (e.g., a high-level task that requires collectively running multiple threads). In a further example, the size (e.g., the number of soft processors within the group of soft processors) of the given soft processor column may be user configuration depending on the task.

The design tools may also include a soft processor system generation tool. The soft processor system generation tool may receive an input based on the suggested hardware configuration. For example, the soft processor system generation tool may receive a selection of partial configuration data (e.g., partial images) from a catalogue of pre-compiled soft processor configurations. The partial configuration data may only partially configure the integrated circuit die. Alternatively, the soft processor system generation tool may receive a selection of full configuration data (e.g., full images) from a catalogue of pre-compiled soft processor configurations. The full configuration data may configure the entire integrated circuit die. The soft processor generation tool may then generate a corresponding configuration bit stream for configuring the integrated circuit.

The integrated circuit implemented using the aggregated profiler and soft processor generation tools may be used as a offloading engine that includes accelerator blocks (e.g., columns of soft processors) to accelerate tasks for a host processor. In order to accelerate the tasks, the offloading engine may include a dynamically reconfigurable number of columns of soft processors as well as interface circuitry (e.g., agnostic interface circuit) coupled to the blocks. The offloading engine is sometimes referred to herein as a "coprocessor" but may in general represent any standalone component. If desired, columns of soft processors may be dynamically grouped together to perform a single task of the tasks for the host processor. If desired, each column of soft process may include soft processors of different processor architecture types. The different processor architectures types of respective soft processors are dynamically reconfigurable.

For example, after completing a first task and prior to receiving a second task, columns of soft processors may dynamically change their soft processor type. As another example, columns of soft processors may dynamically update a cache size for each of the columns. As another example, a number of the columns of soft processors within the integrate circuit may be adjusted.

Further features of the invention, its nature and various advantages will be more apparent from the accompanying drawings and following detailed description.

DETAILED DESCRIPTION

Embodiments of the present invention relate to integrated circuits and, more particularly, to programmable integrated circuits. It will be recognized by one skilled in the art, that the present exemplary embodiments may be practiced without some or all of these specific details. In other instances, well-known operations have not been described in detail in order not to unnecessarily obscure the present embodiments.

Programmable integrated circuits use programmable memory elements to store configuration data. Configuration data may be generated based on source code corresponding to application-specific tasks to be performed in parallel on the programmable integrated circuit. During programming of a programmable integrated circuit, configuration data is loaded into the memory elements. The memory elements may be organized in arrays having numerous rows and columns. For example, memory array circuitry may be formed in hundreds or thousands of rows and columns on a programmable logic device integrated circuit.

During normal operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

It may sometimes be desirable to configure or reconfigure the programmable integrated circuit as an accelerator circuit to efficiently perform parallel processing tasks. The accelerator circuit may include multiple columns soft processors of various types that are specialized for different types of parallel tasks. The accelerator circuit may be dynamically reconfigured to optimally assign and perform the parallel tasks.

Figure 1:
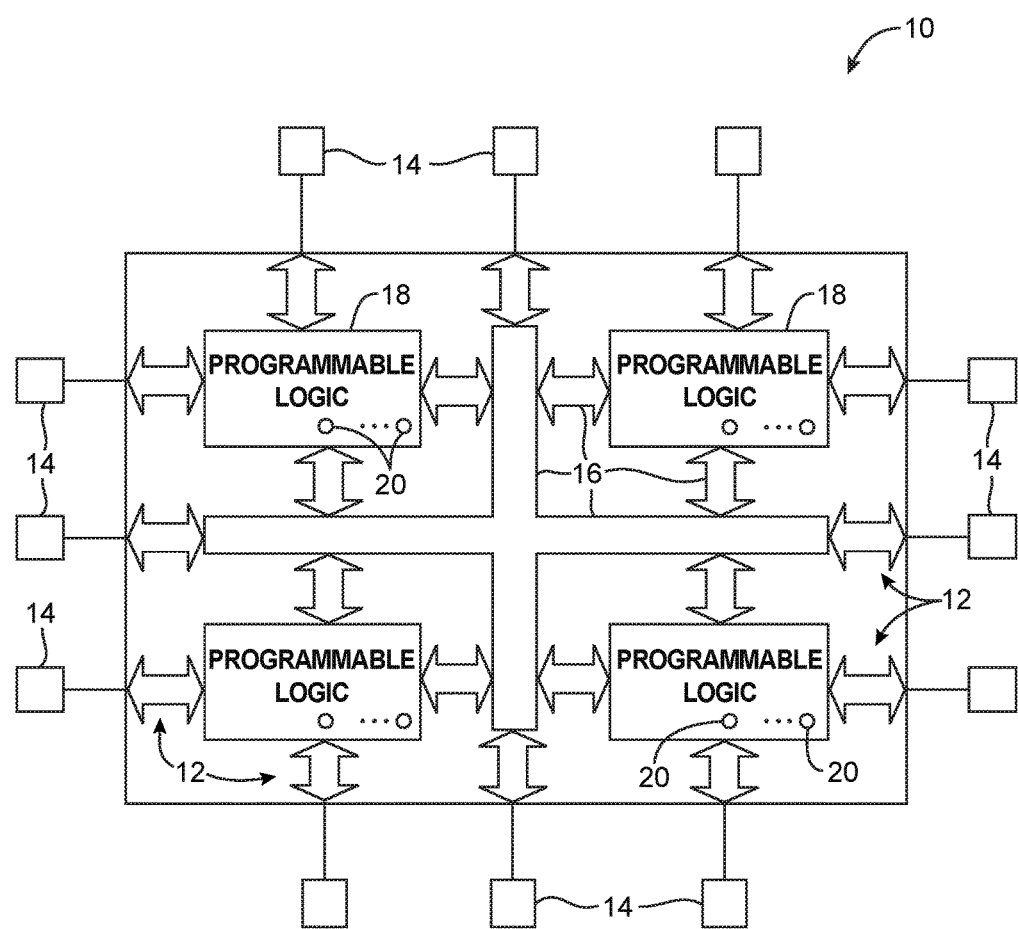
FIG. 1 is a diagram of an illustrative programmable integrated circuit in accordance with an embodiment.

An illustrative programmable integrated circuit such as programmable logic device (PLD) 10 is shown in FIG. 1. As shown in FIG. 1, programmable integrated circuit 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and input-output circuitry 12. Once loaded, the memory elements 20 may each provide a corresponding static control output signal that controls the state of an associated logic component in programmable logic 18. Typically, the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 2:
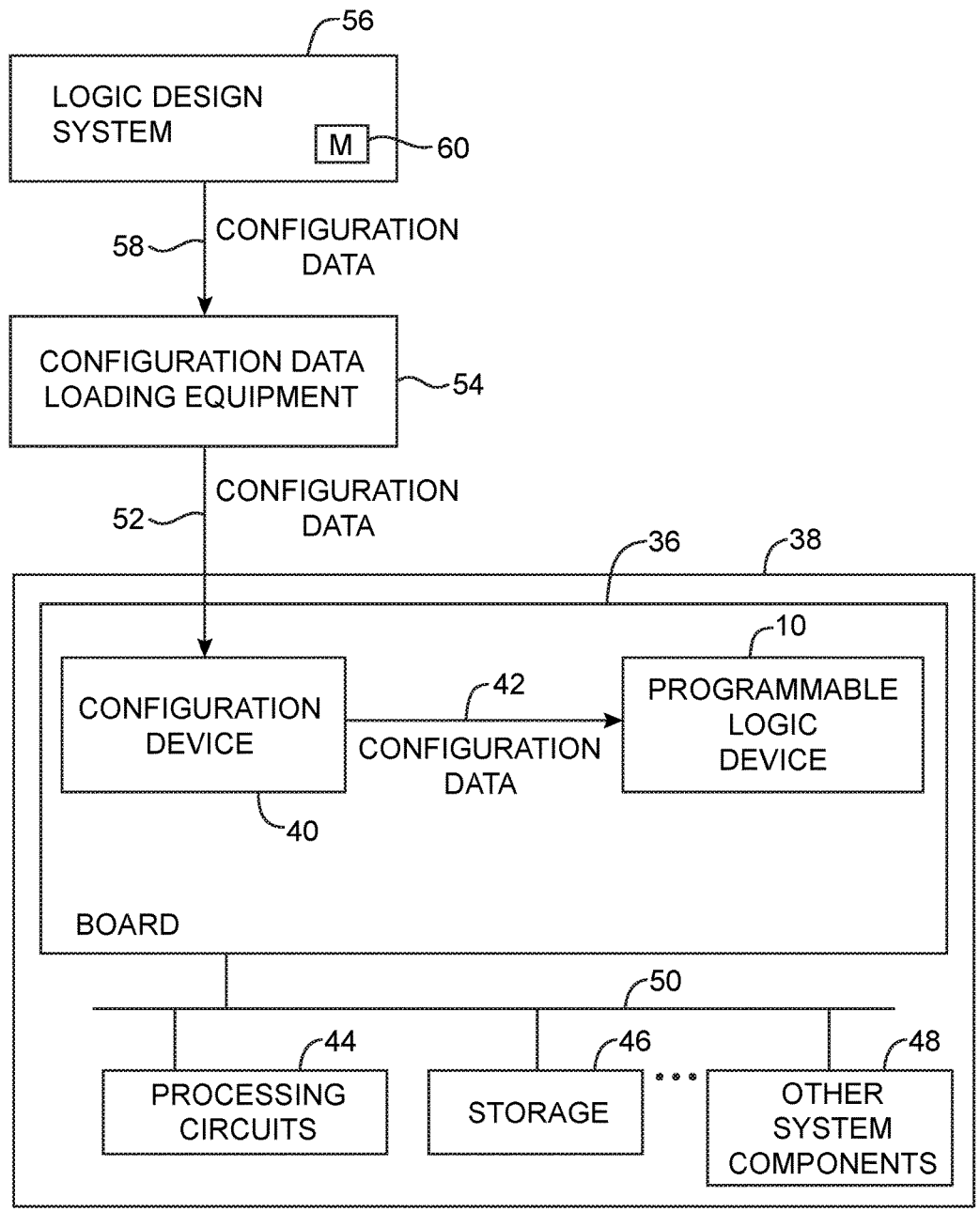
FIG. 2 is a diagram showing how configuration data is created by a logic design system and loaded into a programmable device to configure the device for operation in a system in accordance with an embodiment.

An illustrative system environment for device 10 is shown in FIG. 2. Device 10 may be mounted on a board 36 in a system 38. In general, programmable logic device 10 may receive configuration data from programming equipment or from other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10.

Circuit 40 may be an erasable-programmable read-only memory (EPROM) chip, a programmable logic device configuration data loading chip with built-in memory (sometimes referred to as a "configuration device"), or another suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses, traces, and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42. Logic design system 56 may be based on one or more computers and one or more software programs. In general, software and data may be stored on any computer-readable medium (storage) in system 56 and is shown schematically as storage 60 in FIG. 2.

In a typical scenario, logic design system 56 is used by a logic designer to create a custom circuit design. The system 56 produces corresponding configuration data which is provided to configuration device 40. Upon power-up, configuration device 40 and data loading circuitry on programmable logic device 10 is used to load the configuration data into CRAM cells 20 of device 10. Device 10 may then be used in normal operation of system 38.

After device 10 is initially loaded with a set of configuration data (e.g., using configuration device 40), device 10 may be reconfigured by loading a different set of configuration data. Sometimes it may be desirable to reconfigure only a portion of the memory cells on device 10 via a process sometimes referred to as partial reconfiguration. As memory cells are typically arranged in an array, partial reconfiguration can be performed by writing new data values only into selected portion(s) in the array while leaving portions of array other than the selected portion(s) in their original state.

Figure 3:
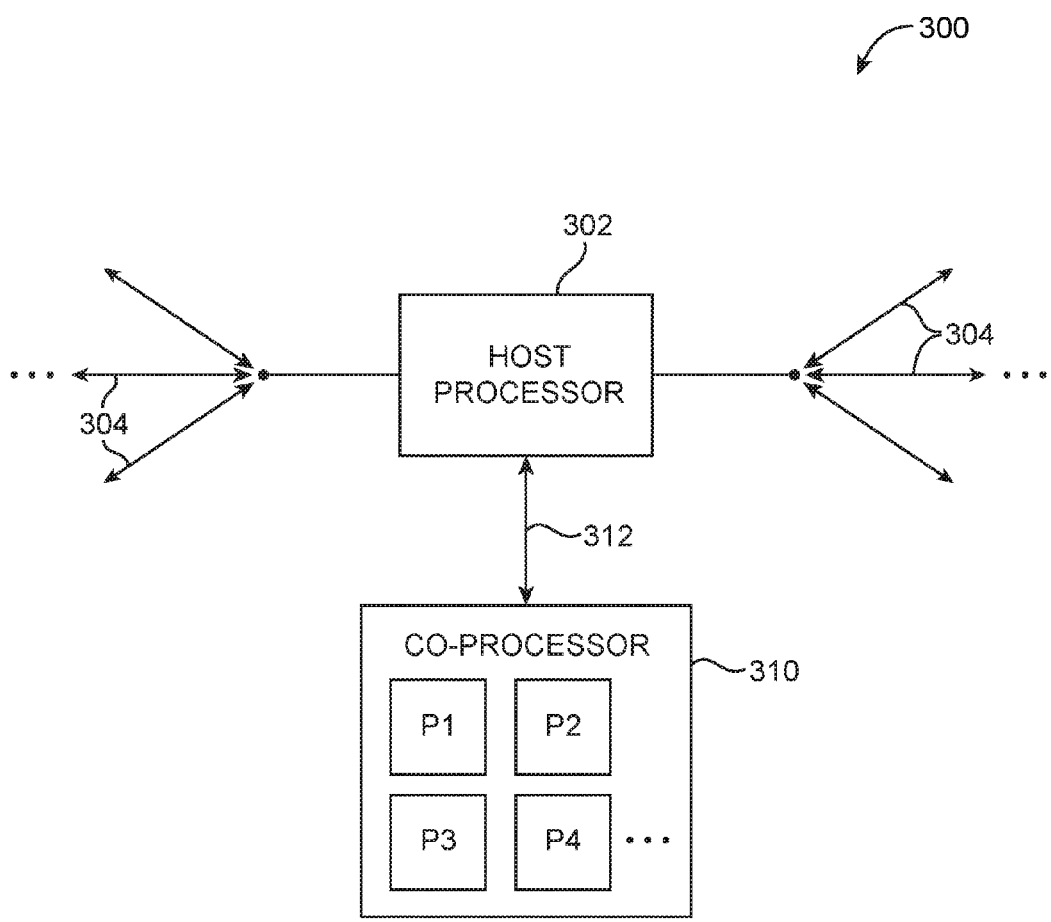
FIG. 3 is a diagram showing how a programmable integrated circuit may be used as a coprocessor in support of a host processor in accordance with an embodiment.

Partial reconfiguration may be a particularly useful feature when developing an acceleration framework. For example, consider a scenario in which a system such as system 300 includes a host processor 302 that is coupled to other network components via paths 304 (see, e.g., FIG. 3). As shown in FIG. 3, host processor 302 may be coupled to a coprocessor (e.g., an accelerator circuit) such as coprocessor 310 (sometimes referred to herein as accelerator circuit 310, or accelerator 310) via path 312. Accelerator circuit 310 may be a programmable integrated circuit such as device 10 of FIG. 1 or alternatively, multiple accelerator circuits may be in a programmable integrated circuit. Accelerator circuit 310 may include various processing nodes (e.g., processing cores, processor cores) such as cores P1-P4 to help accelerate the performance of host processor 302. Cores P1-P4 may be soft processor cores or soft processors that are configurable (e.g., programmable).

Configured as such, accelerator circuit 310 may sometimes be referred to as a "hardware accelerator." As examples, the processing cores on the coprocessor may be used to accelerate a variety of functions, which may include but are not limited to: encryption, Fast Fourier transforms, video encoding/decoding, convolutional neural networks (CNN), firewalling, intrusion detection, database searching, domain name service (DNS), load balancing, caching network address translation (NAT), and other suitable network packet processing applications, just to name a few.

Conventional hardware acceleration is bespoke with no dynamic reconfigurability. Dynamic reconfigurability in accelerators can help offer enhanced flexibility and agility, improved data path line rate performance, and optimized power efficiency in communications networks.

Figure 4:
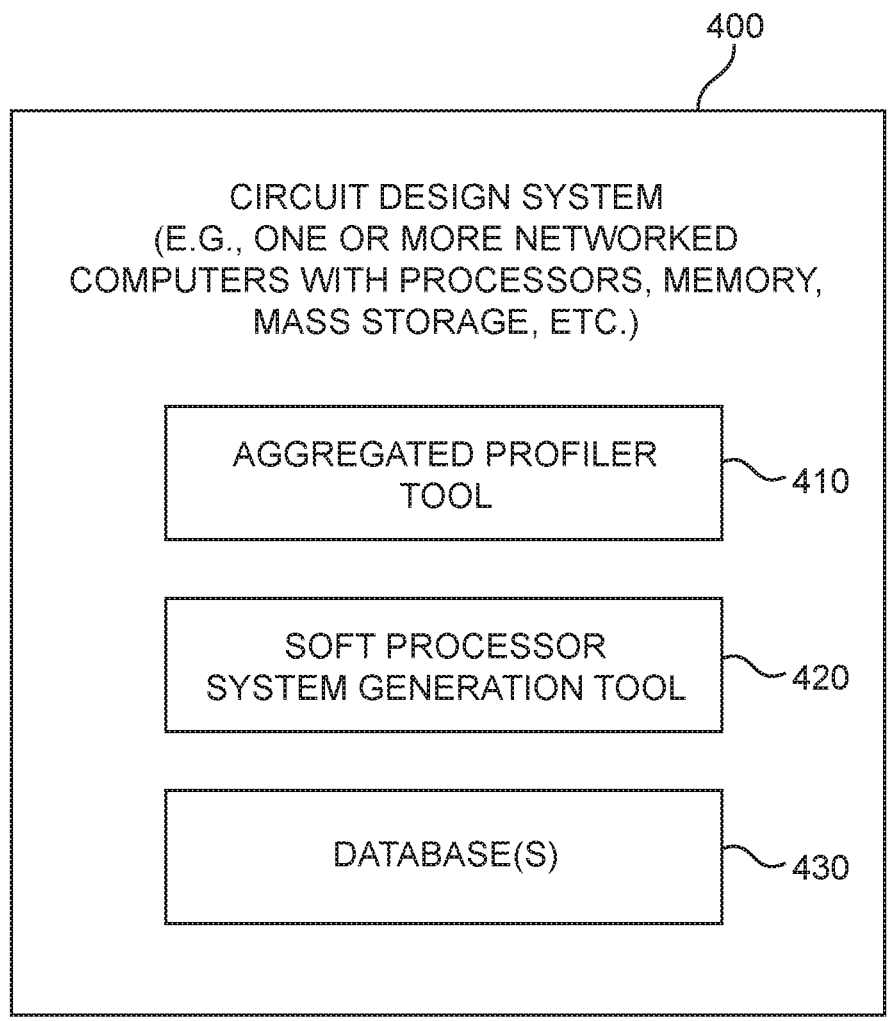
FIG. 4 is a diagram of an illustrative circuit design system that may be used to design an integrated circuit in accordance with an embodiment.

Computer-aided design (CAD) tools may be used to enable dynamic reconfigurability in accelerator circuits. In particular, CAD tools in a circuit design system may configure an integrated circuit to implement cores P1-P4 as shown in FIG. 3, when implementing a circuit design on an integrated circuit. An illustrative circuit design system 400 in accordance with an embodiment is shown in FIG. 4. Circuit design system 400 may be implemented on integrated circuit design computing equipment. For example, system 400 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as aggregated profiler tool 410, soft processor system generation tool 420, and databases 430 reside on system 400. During operation, executable software such as the software of aggregated profiler tool 410 and soft processor system generation tool 420 runs on the processor(s) of system 400. Databases 430 are used to store data for the operation of system 400.

In particular, databases 430 may store data specific for the operations of aggregated profiler tool 410 and soft processor system generation tool 420 during software execution. In general, software and data may be stored on any computer-readable medium (storage) in system 400. Such storage may include computer memory chips, removable and fixed media such as hard disk drives, flash memory, compact discs (CDs), digital versatile discs (DVDs), Blu-ray discs (BDs), other optical media, and floppy diskettes, tapes, or any other suitable memory or storage device(s). When the software of system 400 is installed, the storage of system 400 has instructions and data that cause the computing equipment in system 400 to execute various methods (processes). When performing these processes, the computing equipment is configured to implement the functions of the circuit design system.

System 400 may also include computer aided design (CAD) tools, some or all of which are sometimes referred to collectively as a CAD tool, a circuit design tool, or an electronic design automation (EDA) tool, may be provided by a single vendor or by multiple vendors.

Aggregated profiler tool 410 and soft processor system generation tool 420 may be provided as one or more suites of tools (e.g., a compiler suite for performing tasks associated with implementing a circuit design in a programmable logic device) and/or as one or more separate software components (tools). Database(s) 430 may include one or more databases that are accessed only by a particular tool or tools and may include one or more shared databases. Shared databases may be accessed by multiple tools. For example, a first tool may store data for a second tool in a shared database. The second tool may access the shared database to retrieve the data stored by the first tool. This allows one tool to pass information to another tool. Tools may also pass information between each other without storing information in a shared database if desired.

Using design tools such as aggregated profiler tool 410 and soft processor system generation tool 420 as shown in FIG. 4, configuration data (sometimes referred to as a configuration bit stream) may be generated for a programmable integrated circuit.

The reconfigurability of the programmable integrated circuit may exploited to dynamically configure the programmable integrated circuit to perform offloaded threads (e.g., offloaded tasks from various applications). In particular, threads (e.g., tasks) may be transferred (e.g., offloaded) from a first processor such as host processor 302 of FIG. 3 to a second processor such as co-processor 310. The reconfigurability of the programmable integrated circuit enables the programmable integrated circuit to increase and decrease the number of soft processors (e.g. processors that are programmable to have different processor architectures) used to complete the offloaded threads. The reconfigurability of the programmable integrated circuit also enables the soft processors to be configured to perform different types of software algorithm optimally.

Figure 5:
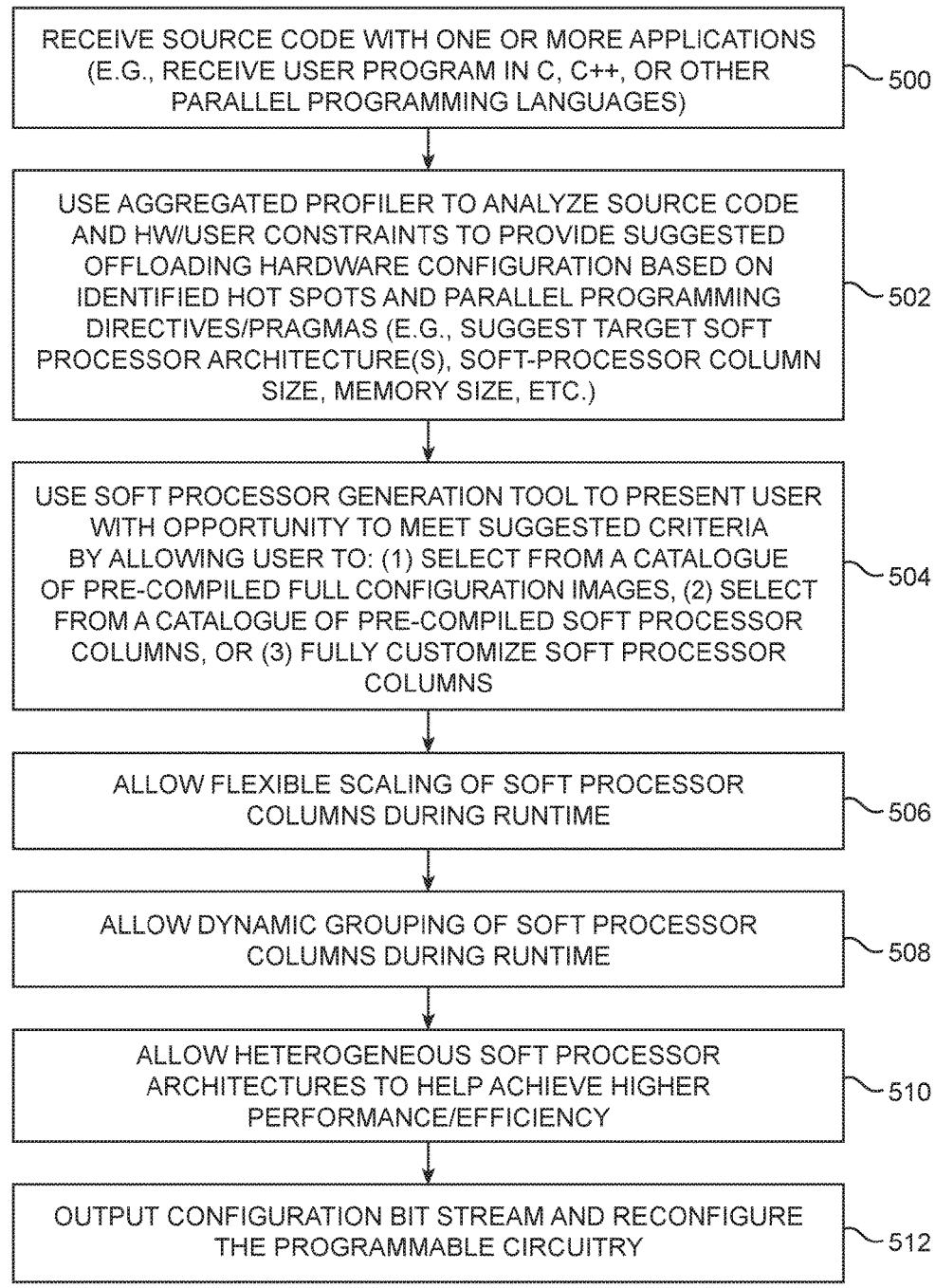
FIG. 5 is a flow chart showing illustrative steps for implementing an integrated circuit in accordance with an embodiment.

FIG. 5 shows a flowchart of illustrative steps for generating the configuration data used to configure (or reconfigure, fully or partially) the programmable integrated circuit using user-generated source code for applications.

At step 500, an aggregated profiler tool such as tool 410 of FIG. 4 may receive a source code. The received source code may include source code from a single application or multiple applications that a user wants to run on the programmable integrated circuit. The source code may be provided in any desirable programming language. For example, the source code may be written in C, C++, FORTRAN, any suitable parallel programming languages, or any other programming languages. As another example, the source code may be generated by multi-processor software acceleration application program interfaces (APIs), such as OpenMP, Cilk, OpenAcc, or any other desirable APIs. Parallel languages or frameworks may convert serial code into codes that may be run as multiple threads.

If desired, the aggregated profiler may also receive constraints for a corresponding programmable integrated circuit. The constraints may include available hardware resources, current allocation of hardware resources, and other information relating to the configurability of the corresponding programmable integrated circuit. If desired, the aggregated profiler may also receive constraints from the user or any other design aspect constraints relevant to the output of the aggregated profiler.

At step 502, the aggregated profiler may analyze the received source code and provide suggested offloading hardware configuration based on identified hot spots and parallel programming directives (e.g., pragmas). The identified hot spots may include large recursive loops and other computing resource intensive processes (e.g., processes that require a large amount of memory, CPU cycles, or hogs I/O circuitry constantly) that may be parallelized. The directives may include user-initiated comments that specify parallelizing certain parts of the source code. The directives may be used to mark (e.g., label) loops that would otherwise not be identified as a hot spot. If desired, the directives may specify a part of the source code to be parallelized by design or for any other reason. The aggregated profiler may also receive information for the number of processing resources available based on the programmable integrated circuit.

Based on the user directives and identified hot spots, the aggregated profiler may generate parameters or criteria relating to hardware allocation within the programmable integrated circuit. For example, if a specific task uses a large number loops (e.g., a large number of repetitive tasks) that were identified as a hot spot, the aggregated profiler may specify a first hardware resource group (a first soft-processor column) that includes a large number of parallel processors (e.g., ten soft processors) for offloading the large number of repetitive tasks. If a specific task uses a moderate number of loops (e.g., a moderate number of repetitive tasks) that were identified using a user directive, the aggregated profiler may specify a second hardware resource group (e.g., a second soft-processor column) that includes a moderate number of parallel processors (e.g., five soft processors) for offloading the moderate number of repetitive tasks.

A soft processor column (e.g., accelerator block) may be in parallel with another processor column. Columns in parallel may complete unrelated tasks and may operate in isolation from one another. If desired, each column may run multiple threads corresponding to the size of the column.

In another example, depending on a type of task specified in the source code, a type of soft processor architecture may also be suggested by the aggregated profiler. More specifically, if arithmetic operations are specified in the large number of repetitive tasks, the ten soft processors may be configured to include ten processors specialized to perform arithmetic operations.

In other words, according to the depth and complexity of the tasks specified within the source code, the aggregated profiler may suggest one or more target soft processor architectures, one or more soft-processor column sizes, corresponding memory sizes for each of the soft-processor columns. These parameters are merely illustrative. If desired, any other parameters may be used to specify properties of the soft processors. Collectively, these parameters generated by the aggregated profiler may specify a configuration of the programmable integrated circuit. These parameters may be optimal as they may use the hardware and software resources of the programmable integrated circuit efficiently. Multiple sets of different optimal parameters may be generated.

The parameters associated with an optimal configuration (e.g. the optimal parameters) of the programmable integrated circuit may be suggested to the user (e.g., displayed to the user using I/O circuitry). If more than one set of parameters are optimal, all sets of parameters may be suggested to the user. The optimal parameters may also be sent to a soft processor generation tool (e.g., soft processor generation tool 420).

At step 504, the soft processor generation tool may present the user with the opportunity to satisfy the criteria (e.g., hardware configuration criteria associated with the output of the aggregated profiler, performance criteria, area constraint criteria, power constraint criteria, etc.) using one of three methods.

A first method may involve allowing the user to select from a catalogue of pre-compiled full configuration images. The configuration bit stream may be directly generated by using a completely pre-compiled full configuration image. The configuration bit stream may be directly instantiated into the programmable integrated circuit. The configuration bit stream of a fully pre-compiled configuration image may configure the entire integrated circuit die. If desired, the configuration bit stream of a fully pre-compiled configuration image may configure an entire functional block within an integrated circuit (e.g., a unit block within an integrated circuit dedicated to be an acceleration circuit).

The catalogue may be stored in databased 430 in FIG. 4. The pre-compiled soft-processor configuration may be directly instantiated into the programmable integrated circuit. By using a pre-compiled soft processor column, compilation time for the hardware may be substantially reduced or simply omitted. This may be desirable during initial design phase of development.

A second method may be to allow the user to select from a catalogue of pre-compiled soft processor columns (e.g., partial configuration images). In other words, the first method may be used to generate a configuration bit stream of a partially pre-compiled configuration image. The configuration bit stream of a partially pre-compiled configuration image may configure only a portion of the integrated circuit die. If desired, the configuration bit stream of a partially pre-compiled configuration image may configure a portion of functional block within an integrated circuit (e.g., a unit block within an integrated circuit dedicated to be an acceleration circuit). The rest of the configuration image may be user-designed and user-customized, if desired or needed. The rest of the configuration image may be implemented using additional functions in the software runtime layer as shown in steps 506, 508, and 510.

In either type of pre-compiled configuration image (partial or full), partial reconfiguration may later be used, if desired or needed to adjust the configuration image or instantiate unconfigured portions of the configuration image.

A third method may involve allowing the user to fully customized the soft processor columns. For example, the user may manually select and configure sections of the programmable integrated circuit based on the parameters received from the aggregated profiler. The selected and configured sections of the programmable integrated circuit may use steps 506, 508, and 510 in generating corresponding configuration data and configuration bit stream. The third method may be used to fine-tune previously fully-compiled configuration images (e.g., using partial reconfiguration).

These three exemplary methods provide the user with a wide spectrum of options. At one end of the spectrum is the first method with compilation time savings but no customizability. At the other end of the spectrum is the third method with high customizability but no compilation time savings. If desired any intermediate option on the spectrum of options may be used to generate the configuration bit stream.

A software runtime layer (not shown) may be used during runtime to adjust the configuration of the soft processor columns during runtime. The software runtime layer may partially reconfigure desired portions of a programmable integrated circuit after soft processor generation tool 420 has generated an initial configuration image (e.g., full or partial configuration image). At step 506, the software runtime layer allows flexible scaling of soft processor columns during runtime (e.g., when tasks for applications are being processed and completed). Flexible scaling may describe how the size of a soft processor column may be configurable. During runtime, various tasks may be assigned and offloaded to soft processor columns within the programmable integrated circuit. The size (e.g., length) of a soft processor column may be reconfigured during runtime according to the offloaded task. For example, if a given soft processor column includes ten soft processors, but only five soft processors are need to complete an offloaded task, the given soft processor column may be reconfigured to include only five soft processors instead of ten. The five soft processors that are no longer included in the given soft processor column may be used in combination with another soft processor column.

As another example, the five soft processors that are no longer included in the given soft processor column may be reconfigured to be included in a separate soft processor column that only includes the five soft processors that are no longer included in the given soft processor column. In other words, the ten original soft processors within the given soft processor column may be reconfigured into two soft processor columns that each have five soft processors. This way the number of columns of soft processors may be changed. However, this is merely an example. Other methods to form new soft processor columns may be used. For example, other completely unconfigured (e.g., used) soft processors may be grouped together to form new soft processor columns.

At step 508, the software runtime layer allows dynamic grouping of soft processor columns during run time. During runtime, a particularly strenuous task may be offloaded to a first soft processor column. It may require a large amount of time to complete the strenuous task using only the first soft processor column. A second soft processor column may be reconfigured to be grouped with the first soft processor column. The grouping of the first and second soft processor columns may complete the strenuous task in combination (e.g., the task may be processed in parallel using both soft processor columns in the group), thereby reducing the amount of time it would have taken the first soft processor column to complete the task alone.

At step 510, the software runtime layer allows heterogeneous soft processor architectures to help achieve higher performance and efficiency. During runtime, two tasks requiring different types of operations (e.g., computationally intensive operations, data packet processing operations) may be offloaded to the programmable integrated circuit. In order to efficiently allocate the two tasks, each task may be offloaded to a soft processor column with a soft processor architecture specialized for the type of the offloaded task.

Steps 506, 508, and 510 within step 504 may be completely or partially hidden from the user, if desired (e.g., if a user implements a fully pre-compiled configuration image). If desired, steps 506, 508, and 510 may be completed based on the parameters received by the soft processor generation tool or the software runtime layer from the aggregated profiler. If desired, steps 506, 508, and 510 may be done automatically, unless otherwise specified by the user.

After using one of the methods associated with step 504 (e.g., the first, second, and third methods) in combination with steps 506, 508, and 510, an optimal or desired configuration data or configuration bit stream corresponding to the input source code may be generated.

At step 512, the configuration bit stream may be ready to be loaded onto the programmable integrated circuit. Therefore, the configuration bit stream may be output to configuration data loading equipment 54 of FIG. 2 or directly to configuration device 40 of FIG. 2. The configuration bit stream may then configure (or reconfigure) the programmable integrated circuit.

The illustrative steps provided in FIG. 5 are merely illustrative. If desired, some steps may be omitted, while others may be repeated. The order of these steps may be altered in any desired way to generate a suitable set of configuration data. Some or all of these steps may be abstracted away from the user (e.g., designer), such that the user may not need to under the complexities associated with some or all of the steps.

Figure 6:
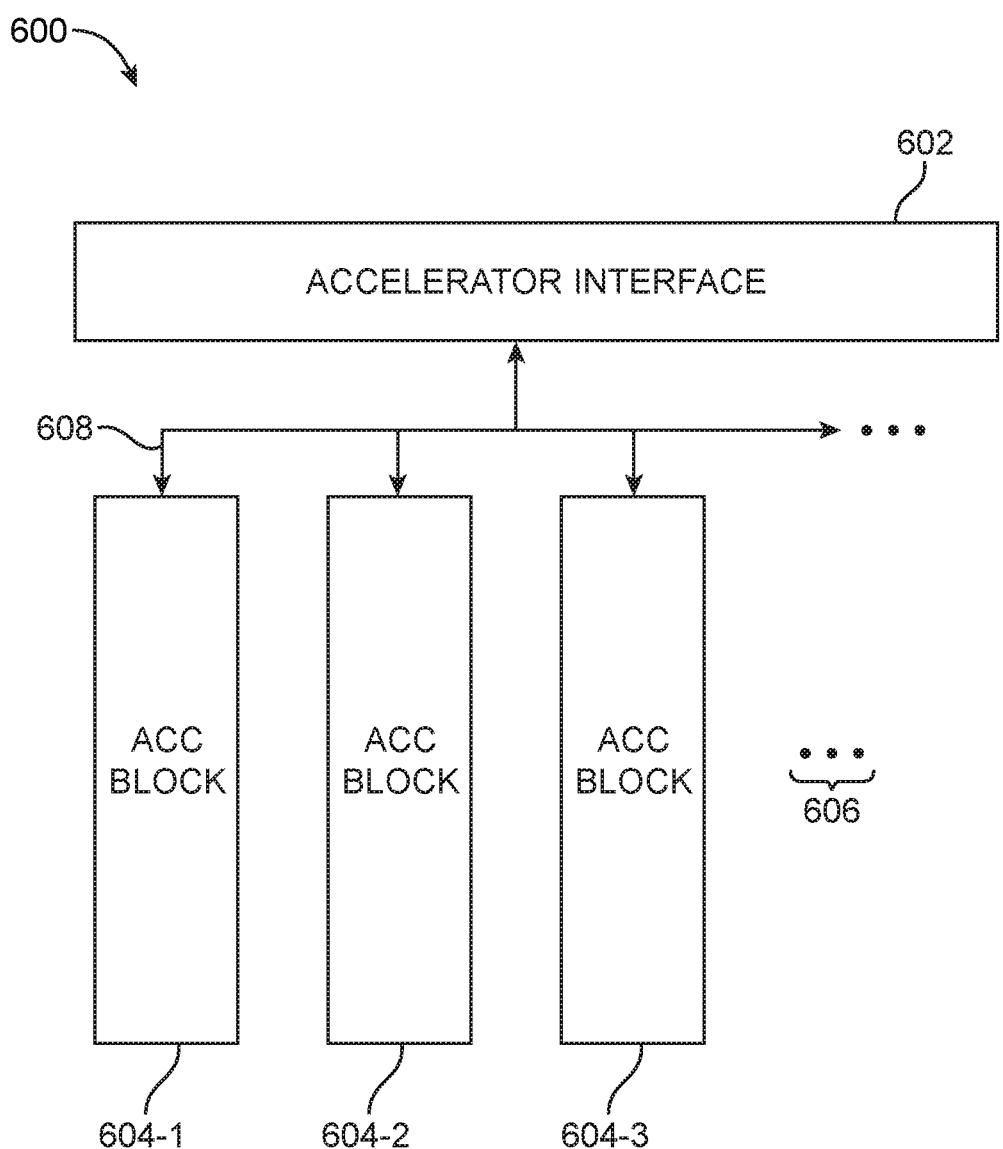
FIG. 6 is a diagram of illustrative acceleration circuitry that includes soft processors in accordance with an embodiment.

FIG. 6 shows an illustrative accelerator circuit that includes soft processors within a programmable integrated circuit. Accelerator circuitry 600 (sometimes referred to herein as accelerator 600) may include multiple accelerator blocks 604 (e.g., accelerator blocks 604-1, 604-2, 604-3, etc.) and accelerator interface 602. Accelerator interface 604 may communicate with the multiple accelerator blocks 604 via paths 608. Each accelerator block 604 may include a column of soft processor column and may therefore sometimes be referred to as a column of soft processors. For example, accelerator block 604-1 may include a soft processor column having a group of soft processors that are grouped together as a processing cluster. Accelerator block 604-2 may also include another soft processor column having another group of soft processors. If desired, an accelerator block may include multiple soft processor columns (each of which has its own group of soft processors) that are grouped together as a larger processing cluster.

Acceleration circuitry 600 that includes multiple soft processor columns may be referred to as having a hybrid mesh architecture. The hybrid mesh architecture shares the benefits of processing efficiency of shared memory and scalability of the mesh structure. Multiple soft processor columns may be instantiated in parallel during software configuration in response to processing loaded tasks. Acceleration circuitry may also perform auto-discovery functions to generate a number of available processing resources within the acceleration circuitry or within the programmable integrated circuit.

Accelerator interface 602 may convey information from other parts of the programmable integrated circuit to accelerator blocks 604. Accelerator blocks 604 may also convey information from each accelerator block 604 to other parts of the programmable integrated circuit. If desired, accelerator interface 602 may relay configuration data information to accelerator blocks 604 to configure or reconfigure some or all accelerator blocks 604. If desired, accelerator interface 602 may also relay assignment information regarding offloaded tasks to accelerator blocks 604. Accelerator blocks 604 may also relay task results to accelerator interface for subsequent instructions. These operations are merely exemplary. If desired, any information conveyed to and from accelerator blocks 604 may be first processed by accelerator interface 602. Alternatively, if desired, some information may bypass accelerator interface 602.

Accelerator blocks 604-1, 604-2, and 604-3 are merely illustrative. If desired, accelerator 600 may include any number of accelerator blocks as indicated by ellipses 606. For example, accelerator 600 may include one, two, four, or more than four accelerator blocks as desired.

The additional accelerator blocks as indicated by ellipses 606 may be added through dynamic reconfiguration (i.e. reconfiguration occurring during runtime). For example, hardware resources not previously configured or previously configured for other purposes may be instantiated or reconfigured during a partial reconfiguration to implement (e.g., create) additional accelerator blocks. This process may continue as desired to create any number of suitable accelerator blocks. Similarly, a reverse process may occur to remove active accelerator blocks as desired. Accelerator blocks may be added to increase the processing capabilities an integrated circuit (e.g., acceleration capabilities of a co-processor). Accelerator blocks may be removed to save limited hardware resources, or lower power consumptions. Any suitable number of accelerator blocks may be implemented based on the types and quantity of tasks offloaded to the accelerator circuit. Tasks may be offloaded in real-time (e.g., during runtime). To optimize efficiency, the number of accelerator blocks may be instantiated dynamically during runtime.

Figure 7:
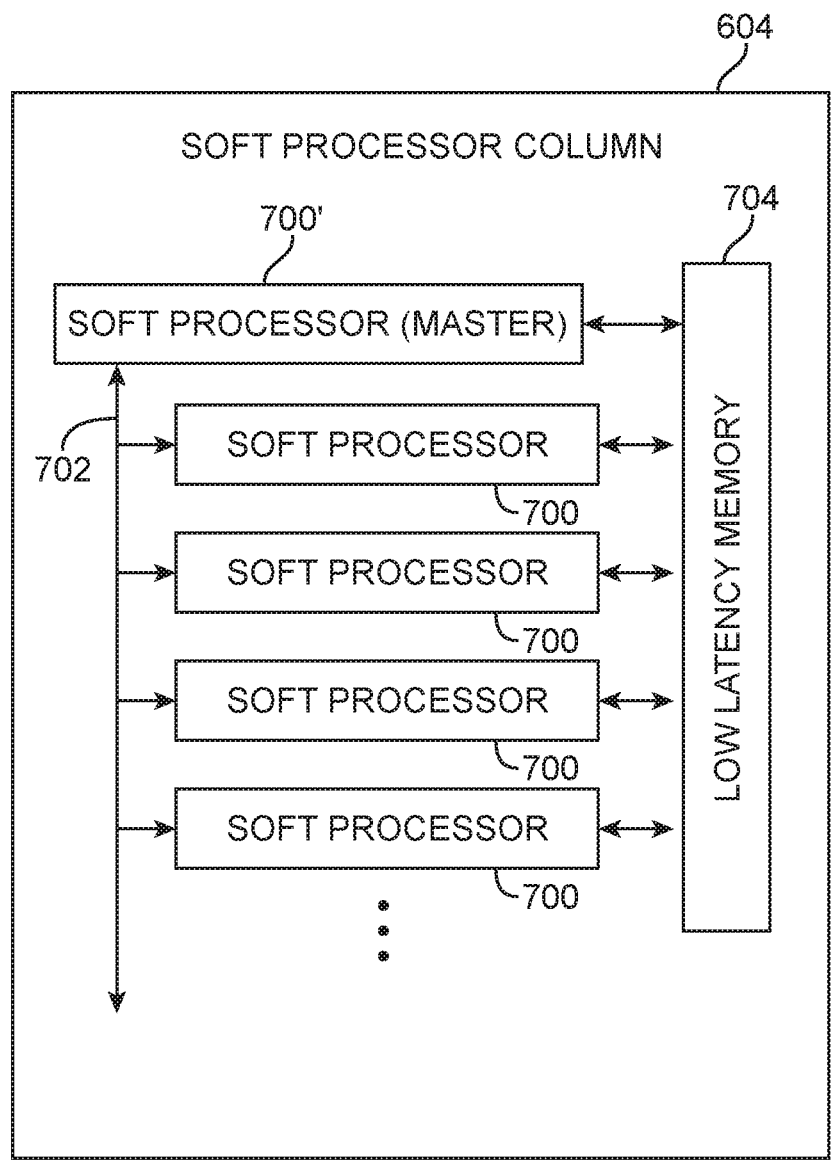
FIG. 7 is a diagram of an illustrative soft processor column within acceleration circuitry of the type shown in FIG. 6 in accordance within an embodiment.

FIG. 7 shows a diagram of an illustrative soft-processor column previously described in connection with FIG. 6. Soft processor column 604 may include master soft processor 700'(sometimes referred to herein simply as master processors 700') and soft processors 700. Master soft processor may communicate to soft processors 700 via path 702. Any number of soft processors may be within soft processor column 604 as shown by the ellipses. Furthermore, additional soft processors that may be added to processor column 604 (to achieve a desired number of soft processors) may be added dynamically based on the task to be performed (e.g., dynamically reconfigured during runtime). Existing soft processors that may be removed from processor column 604 (to achieve a desired number of soft processors) may be removed dynamically based on the task to be performed (e.g., dynamically reconfigured during runtime). For example, soft processor column 604 may include one, two, three, five, ten, or any other suitable number of soft processors.

An optimal number of soft processors may be specified by aggregated profiler tool 410 in FIG. 4. Because tasks may differ from time to time and to avoid under-utilization of processor columns or over-utilization of processor column, the number of soft processors within a processor column may be dynamically adjusted during runtime. This process may occur in preparation for a future task (e.g., in preparation for an offloaded task).

Master soft processor 700' may serve as a scheduler (e.g., a role to coordinate and distribute tasks) within soft processor column 604. For example, master soft processor 700' may assign tasks to be completed by soft processors 700. Especially in the scenario of parallel processing, master soft processor 700' may provide timing signals to soft processors 700 to ensure tasks are completed efficiently. If desired, accelerator interface circuitry 602 may communicate with master soft processor 700' to assign the tasks to be completed by soft processors 700'.

Soft processor column may also include memory circuitry 704 (e.g., low latency memory 704). Memory circuitry 704 may serve as a cache memory that is shared by processors 700 and master processor 700'. Master processor may also manage the sharing of memory circuitry 704. If desired, memory circuitry 704 may be any type of low latency memory (e.g., similar to L2 cache). Memory size of memory circuitry 704 may also be dynamically reconfigured during runtime.

Figure 8:
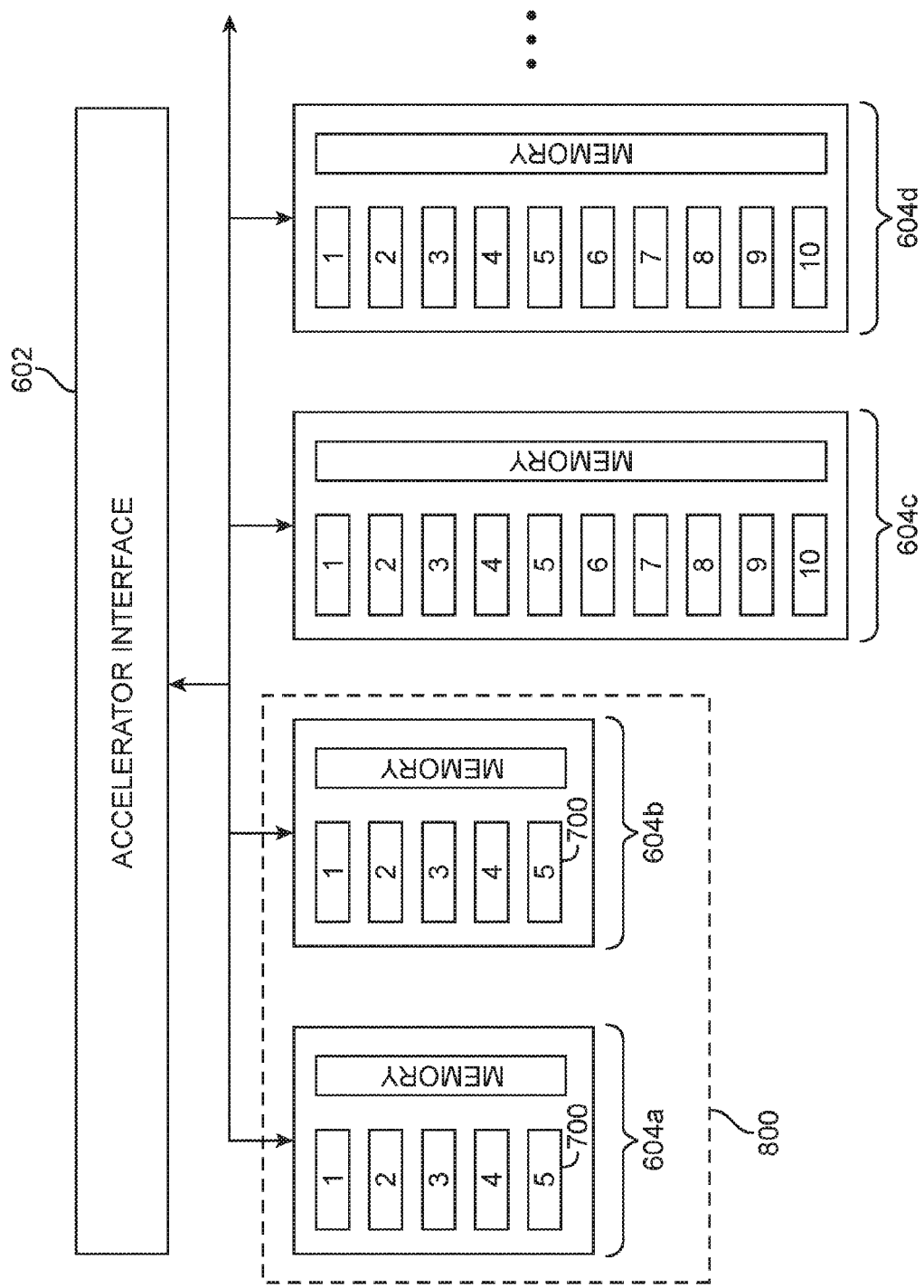
FIG. 8 is a diagram of illustrative acceleration circuitry that includes multiple soft processor columns of varying sizes in accordance with an embodiment.

FIG. 8 shows illustrative acceleration circuitry that includes multiple soft processor columns of varying sizes. The acceleration circuitry of FIG. 8 may include soft processor columns 604a and 604b, each of which includes a master soft processor, four other soft processors, and memory (e.g., a locally shared cache). The acceleration circuitry may also include soft processor columns 604c and 604d, each of which includes a master soft processor, nine other soft processors, and memory.

Soft processor columns 604a and 604b may be grouped together as processing group 800 to achieve higher processing power. In particular, having two processor columns each with five soft processors may provide more granular control when compared with a signal processor column with ten soft processors. To achieve process runtime task efficiently, processor columns may be grouped together as in group 800. In another example, if desired, group 800 may be reconfigured to have a structure similar to column 604 and vice versa.

Motivation for regrouping may come from a relative processing load of each respective column. When a processor column is under-utilized, some of the soft processors in that column may be removed or more tasks may be assigned to the under-utilized processor column. When a processor column is over-utilized, soft processors may be added to that column, other columns may be grouped with the over-utilized column, or tasks may be delegated to other columns. In another example, processor columns may be removed altogether to save power or be reconfigured for other uses. These examples are merely illustrative. If desired, any desired and suitable reconfiguration of processor columns within an accelerator may be implemented.

The acceleration circuitry of FIG. 8 including four soft processor columns is merely illustrative. If desired any number of soft processor columns may be within the acceleration circuitry. This may be implemented dynamically during runtime in preparation for future tasks. In other words, a number of soft processor columns may be dynamically changed. For example, an acceleration circuitry may include one, two, three, or more than four soft processor columns. Each of the column may also include any number of soft processors. This may also be implemented dynamically during runtime. In other words, a number of soft processors within a column maybe dynamically changed.

Figure 9:
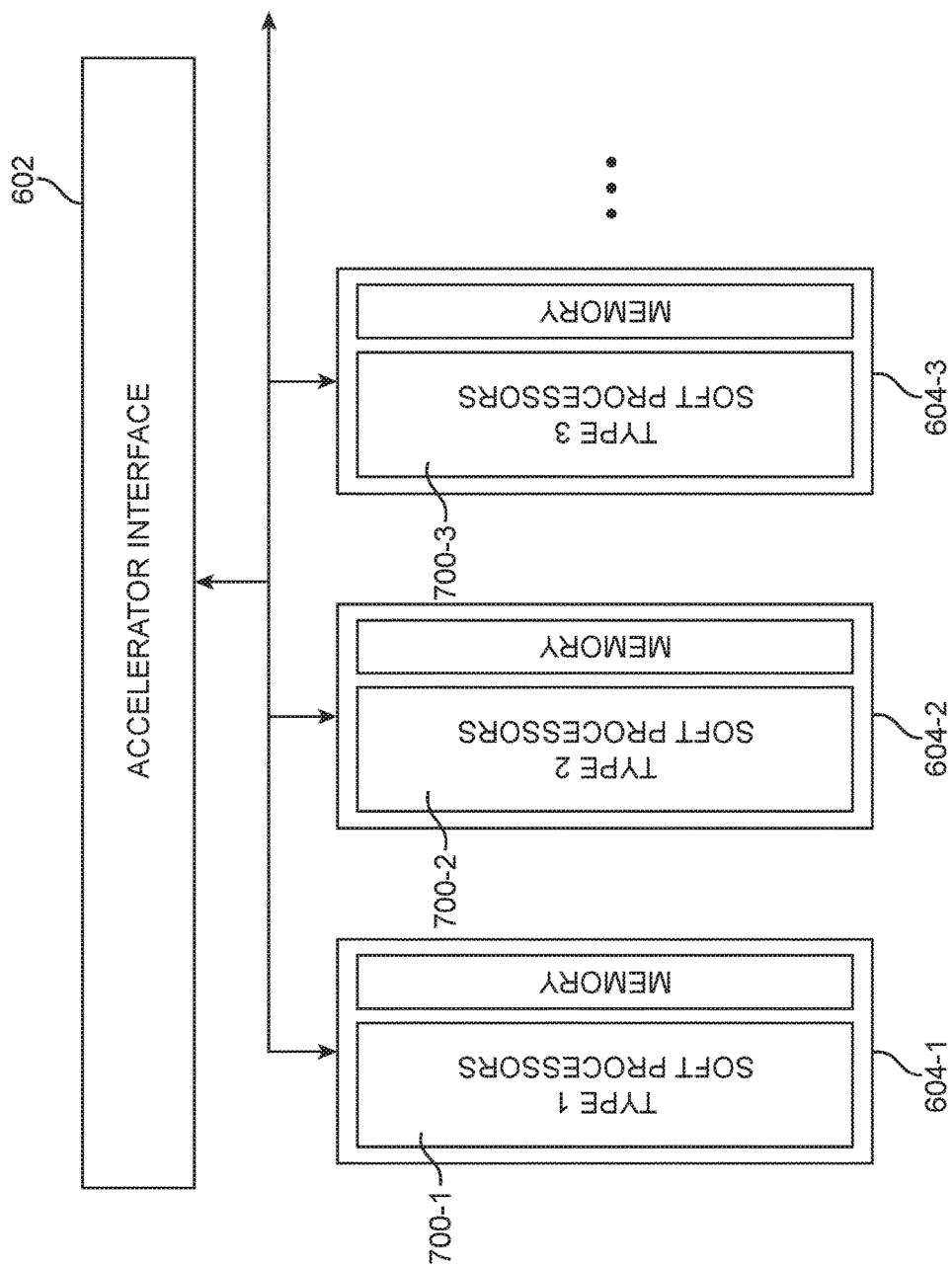
FIG. 9 is a diagram of illustrative acceleration circuitry that includes multiple soft processor columns of different soft processor architecture types accordance with an embodiment.

FIG. 9 shows illustrative acceleration circuitry that includes multiple soft processor columns of varying types of soft processors. In particular, the acceleration circuitry of FIG. 9 includes soft processor columns 604-1, 604-2, and 604-3, each of which includes memory circuitry (e.g., a locally shared cache).

To flexibly and efficiently complete tasks, soft processors within each soft processor column may be of a different type (e.g., each soft processor column may be implemented using a different type of soft processor architecture). As shown in FIG. 9, soft processor column 604-1 may include a first type of soft processors 700-1. Soft processor column 604-2 may include a second type of soft processors 700-2. Soft processor column 604-3 may include a third type of soft processors 700-3. These different types of soft processors may be preselected from an output of the aggregated profiler.

The types of processors may include, but are not limited to: general use processors, application-specific instruction set processors (ASIPs), data packet processing processors, other specialized processors, reduced instruction set computing (RISC-type) processors, and complex instruction set computing (CISC-type) processors. If desired, any suitable types of processors may be used. The soft processor may be configured dynamically to implement the architecture of any of the suitable types of processors. In other words, the processor architecture may be dynamically changed during run time.

For example, at a given time, the first type of soft processors 700-1 may implement (e.g., may be configured with) a general use processor architecture, the second type of soft processors 700-2 may implement an application-specific instruction set processor architecture, and the third type of soft processor may implement a data packet processing architecture. At another given time, the first type of soft processors 700-1 may be reconfigured to have an ASIP architecture. This is merely illustrative. If desired, any or all of soft processors may be reconfigured to have any suitable processor architecture at any given time based on the types of tasks to be offloaded to the respective soft processors.

For example, during runtime, computationally intensive tasks may be offloaded to soft processor columns with ASIPs that may be specialized to complete the computationally intensive tasks (e.g., square root operations, floating point, FIR filter, etc.). If no soft processor columns are available to perform the computationally intensive tasks, soft processors within another soft process column may be reconfigured (in a partial reconfiguration) to have ASIP architecture. In particular, computational code may be received at a general compiler to provide instruction sets to a backend compiler. The backend compiler may provide a custom ASIP that is specialized in performing the instruction set. If desired, any soft processors may be reconfigured to have ASIP architecture customized to complete offloaded tasks.

In another example, data packet processing processors may be used in applications that require specialization in data packet streaming and processing, or other network based routing tasks. General use processors may be used in general applications (e.g., multiply, shift, etc.). These processor architectures are presented merely as examples. If desired, any processor architecture may be used to specialize in tasks the processor architecture can efficiently perform.

FIGS. 6-9 are merely illustrative. If desired, the embodiments of these figures may be combined to generated a suitable configuration for a programmable integrated circuit. The programmable integrated circuit may provide runtime instantiating capabilities that allow its configuration to be malleable.

Figure 10:
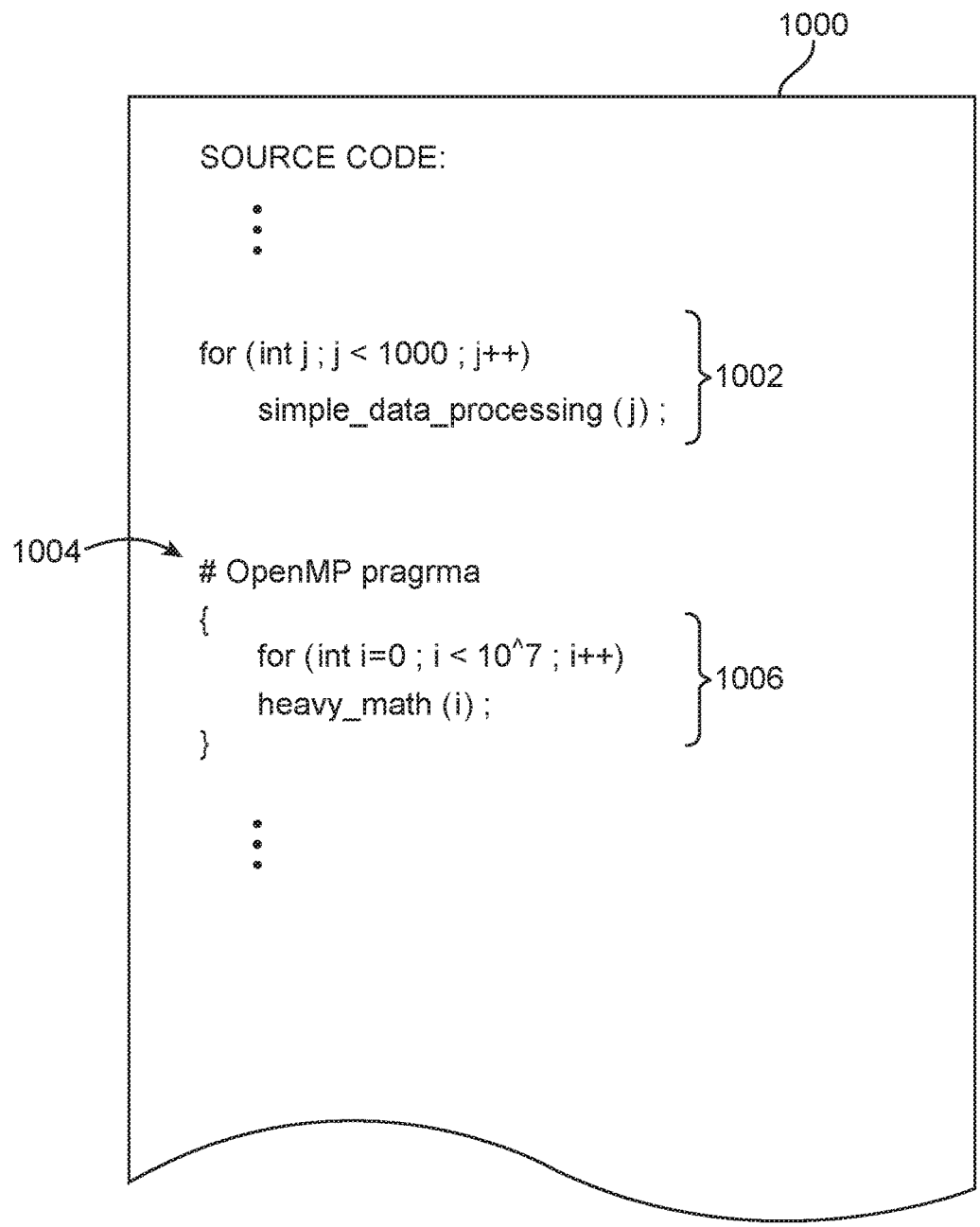
FIG. 10 is a diagram of illustrative source code that is parsed to design and configure soft processors on an integrated circuit in accordance with an embodiment.

FIG. 10 shows an exemplary portion of source code. Source code 1000 may be received at aggregated profiler tool 410 of FIG. 4 to provide parameters for configurations (e.g., soft processor type, soft processor column size, etc.). Source code 1000 may include portion 1002, which specifies a loop of simple data processing tasks (e.g., a set of simple, but repetitive tasks). Portion 1002 may be identified by the aggregated profiler as a hot spot or a potential bottleneck. In order to optimize performance, a single soft processor column may be used to complete the tasks in parallel. The single soft processor column may use five processors of Nios II architecture. The five processor may be used to provide parallel processing capabilities. The Nios II architecture may be used because the individual tasks are relatively simple data processing tasks.

Source code 1000 may also include portion 1006, marked by a parallel language directive 1004 (or pragma 1004). User pragma 1004 may be specified in a parallel computing API such as OpenMP. If desired, other forms of inputs may be taken as user pragmas or user directives (e.g., hints about executing the code).

User pragma 1004 may include information for parallelizing portions of code. In particular, user pragma 1004 may be used to instruct processors to perform portion 1006 in parallel. Portion 1006 may include a large loop of complex math tasks (e.g., a large set of complex math tasks). Consequently, aggregated profiler tool 410 of FIG. 4 may specify that a soft processor column with ten soft processors configured to have ASIP architecture for a relevant group of instruction sets.

However, this is merely illustrative. If desired, any suitable number of soft processors of any type may be used for perform any portions of source code 1000. Source code 1000 may also include other portions of code that may be identified as hot spots or identified using user pragmas. These identified hot spots or identified portions may be offloaded to suitable candidates of processing resources as previously described.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA/INTEL Corporation.

The foregoing is merely illustrative of the principles of this invention and various modifications can be made by those skilled in the art. The foregoing embodiments may be implemented individually or in any combination.

What is claimed is:

1. A method of implementing an integrated circuit using an aggregated profiler tool running on circuit design computing equipment, comprising:
   with the aggregated profiler tool, receiving a source code;
   with the aggregated profiler tool, analyzing the source code to identify resource-intensive tasks;
   in response to identifying the resource-intensive tasks, outputting suggested hardware configurations for soft processors on the integrated circuit;
   presenting a user with opportunity to select from among the suggested hardware configurations and receiving from the user a corresponding selection;
   generating a configuration bit stream based on the received selection; and
   loading the configuration bit stream into the integrated circuit.

2. The method of claim 1, wherein outputting the suggested hardware configurations comprises outputting a suggested number of soft processors for a column of soft processors.

3. The method of claim 2, wherein outputting the suggested hardware configurations further comprises outputting a suggested number of columns of soft processors.

4. The method of claim 3, wherein outputting the suggested hardware configurations further comprises outputting different suggested types of soft processor architectures for at least two columns in the number of columns.

5. The method of claim 2, wherein outputting the suggested hardware configurations further comprises outputting a suggested memory size for the column of soft processors.

6. The method of claim 1, wherein receiving the selection comprises receiving a selection of partial configuration data from a catalogue of pre-compiled soft processor configurations, and wherein the partial configuration data only partially configures the integrated circuit.

7. The method of claim 1, wherein receiving the input comprises receiving a selection of full configuration data from a catalogue of pre-compiled soft processor configurations, and wherein the full configuration data completely configures the integrated circuit.

8. A method of implementing an integrated circuit using an aggregated profiler tool running on circuit design computing equipment, comprising:
   with the aggregated profiler tool, receiving a source code;
   with the aggregated profiler tool, analyzing the source code to identify resource-intensive tasks by identifying parallel programming directives; and
   in response to identifying the resource-intensive tasks, outputting a suggested hardware configuration for soft processors on the integrated circuit;
   presenting a user with opportunity to select from among the suggested hardware configurations and receiving from the user a corresponding selection;
   generating a configuration bit stream based on the received selection;
   loading the configuration bit stream into the integrated circuit.

9. The method of claim 8, wherein the source code is written in C or C++.

10. The method of claim 8, wherein the source code is written in FORTRAN.

11. A method of implementing an integrated circuit using an aggregated profiler tool running on circuit design computing equipment, comprising:
   with the aggregated profiler tool, receiving a source code;
   with the aggregated profiler tool, analyzing the source code to identify resource-intensive tasks;
   in response to identifying the resource-intensive tasks, outputting a plurality of suggestions for hardware settings on the integrated circuit;
   in response to outputting the plurality of suggestions, receiving an externally-supplied selection chosen from among the plurality of suggestions;
   generating a configuration bit stream based on the externally-supplied selection; and
   loading the configuration bit stream into the integrated circuit.

* * * * *